(12) United States Patent
Chen et al.

(10) Patent No.: US 10,886,594 B2
(45) Date of Patent: Jan. 5, 2021

(54) PACKAGING STRUCTURE AND PACKAGING METHOD FOR ANTENNA

(71) Applicant: SJ Semiconductor(Jiangyin) Corporation, Jiangyin (CN)

(72) Inventors: Yenheng Chen, Jiangyin (CN); Chengchung Lin, Jiangyin (CN); Chengtar Wu, Jiangyin (CN); Jangshen Lin, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 0 days.

(21) Appl. No.: 16/286,310

(22) Filed: Feb. 26, 2019

(65) Prior Publication Data

US 2019/0288370 A1 Sep. 19, 2019

(51) Int. Cl.
*H01L 23/48* (2006.01)
*H01Q 1/22* (2006.01)
*H01L 23/66* (2006.01)
*H01L 23/00* (2006.01)
*H01L 23/498* (2006.01)
(Continued)

(52) U.S. Cl.
CPC ......... *H01Q 1/2283* (2013.01); *H01L 21/486* (2013.01); *H01L 21/4857* (2013.01); *H01L 23/49816* (2013.01); *H01L 23/49822* (2013.01); *H01L 23/49894* (2013.01); *H01L 23/66* (2013.01); *H01L 24/16* (2013.01); *H01L 24/81* (2013.01); *H01L 21/6835* (2013.01); *H01L 2221/68318* (2013.01); *H01L 2221/68345* (2013.01); *H01L 2221/68359* (2013.01); *H01L 2221/68372* (2013.01); *H01L 2223/6611* (2013.01); *H01L 2223/6677* (2013.01); *H01L 2924/014* (2013.01); *H01L 2924/1579* (2013.01); *H01L 2924/15184* (2013.01); *H01L 2924/15788* (2013.01)

(58) Field of Classification Search
CPC . H01Q 1/2283; H01L 21/486; H01L 21/4857; H01L 2223/6677; H01L 23/66
USPC .................................................. 257/737, 774
See application file for complete search history.

(56) References Cited

U.S. PATENT DOCUMENTS

6,946,380 B2 * 9/2005 Takahashi ......... H01L 23/49575
438/612
9,984,992 B2 * 5/2018 DeLaCruz .............. H01L 24/97
(Continued)

*Primary Examiner* — Nitin Parekh
(74) *Attorney, Agent, or Firm* — Alston & Bird LLP (57) ABSTRACT

The present disclosure provides a packaging structure and a packaging method for an antenna. The packaging structure comprises a redistribution layer, having a first surface and an opposite second surface; a first metal joint pin, formed on the second surface of the redistribution layer; a first packaging layer, disposed on the redistribution layer covering the first metal joint pin; a first antenna metal layer, patterned on the first packaging layer, and a portion of the first antenna metal layer electrically connects with the first metal joint pin; a second metal joint pin, formed on the first antenna metal layer; a second packaging layer, disposed on the first antenna metal layer covering the second metal joint pin; a second antenna metal layer, formed on the second packaging layer; and a metal bump and an antenna circuit chip, bonded to the first surface of the redistribution layer.

20 Claims, 8 Drawing Sheets

(51) Int. Cl.
*H01L 21/48* (2006.01)
*H01L 21/683* (2006.01)

(56) References Cited

U.S. PATENT DOCUMENTS

| | | | |
|---|---|---|---|
| 2006/0049995 A1* | 3/2006 | Imaoka | H01Q 1/2283 |
| | | | 343/702 |
| 2018/0158787 A1* | 6/2018 | Chang | H01L 21/4857 |
| 2018/0358312 A1* | 12/2018 | Yu | H01L 21/4857 |
| 2019/0019756 A1* | 1/2019 | Yu | H01L 23/66 |
| 2019/0035749 A1* | 1/2019 | Dalmia | H01Q 21/065 |
| 2019/0096828 A1* | 3/2019 | Wu | H01L 23/5384 |
| 2019/0137208 A1* | 5/2019 | Messinger | F41A 27/18 |
| 2019/0189572 A1* | 6/2019 | Chiang | H01L 23/5383 |
| 2019/0333882 A1* | 10/2019 | Kamgaing | H01L 21/4857 |

* cited by examiner

PACKAGING STRUCTURE AND PACKAGING METHOD FOR ANTENNA

CROSS REFERENCES TO RELATED APPLICATIONS

This application claims the benefit of priority to Chinese Patent Application No. CN2018203598256, entitled "Packaging Structure for Antenna", filed with SIPO on Mar. 16, 2018, and Chinese Patent Application No. CN2018102175884, entitled "Packaging Structure and Packaging Method for Antenna", filed with SIPO on Mar. 16, 2018, the contents of which are incorporated herein by reference in its entirety.

TECHNICAL FIELD

The present disclosure relates to the technical field of semiconductor packaging, and in particular, to a packaging structure and packaging method for an IC antenna.

BACKGROUND

Various high-tech electronic products have been developed to bring convenience to users, including various electronic devices such as laptops, mobile phones, and portable Android devices (PAD), etc.

Increased demands for these popular high-tech electronic products have enabled more functions and applications configured into these high-tech products. In addition, to meet the need for mobilization, the function of wireless communication is provided. Thus, users can access the high-tech electronic devices with the function of wireless communication anywhere or any time. This greatly increases the flexibility and convenience in use of these high-tech electronic products. Therefore, users no longer have to be confined to a certain area, and can enjoy the convenience brought by these electronic products.

In general, existing antenna structures in IC devices usually have many types, for examples, they are dipole antenna, monopole antenna, patch antenna, planar inverted-F antenna, meander line antenna, inverted-L antenna, loop antenna, spiral antenna and spring antenna. A known practice is to manufacture an antenna directly on the surface of a circuit board. By this practice, an antenna occupies an extra space of the circuit board, thereby resulting in a low integration level. For various electronic devices, a large circuit board means a large size. However, the main purpose of designing and developing these electronic devices is to allow users to carry them easily. Therefore, how to reduce the area of the circuit board occupied by an antenna, and improve the integration performance of an antenna packaging structure is the key to solve the problems of these electronic devices.

In addition, an existing antenna package is typically of a single-layer structure with low antenna efficiency, which cannot meet the increasing demand for antenna performance.

Based on the above, it is necessary to provide a packaging structure and packaging method for an antenna with a high integration level and high efficiency.

SUMMARY

The present disclosure provides an IC antenna structure and packaging method for making the antenna.

The structure an IC antenna structure, comprising: a redistribution layer having a first surface and an opposite second surface; a first metal joint pin, formed on the second surface of the redistribution layer; a first packaging layer, disposed on the second surface of the redistribution layer covering the first metal joint pin, wherein the top surface of the first metal joint pin is configured to be exposed from the first packaging layer; a first antenna metal layer, formed on the first packaging layer and configured to have a portion connect electrically to the first metal joint pin; a second metal joint pin, formed on the portion of the first antenna metal layer connecting to the first metal joint pin; a second packaging layer, disposed on the first antenna metal layer, covering the second metal joint pin, wherein the top surface of the second metal joint pin is configured to be exposed from the second packaging layer; a second antenna metal layer, formed on the second packaging layer, wherein a portion of the second antenna metal layer connecting to the second metal joint pin; a metal bump, formed on the first surface of the redistribution layer; and an antenna circuit chip, bonded to the first surface of the redistribution layer.

Preferably, the first packaging layer is made from one of polyimide, silica gel and epoxy resin, and the second packaging layer is made from one of polyimide, silica gel and epoxy resin.

Preferably, the redistribution layer comprises a patterned first dielectric layer, a patterned first metal wiring layer, a patterned second dielectric layer and a patterned second metal wiring layer which are sequentially stacked, and the first metal wiring layer is electrically connected with the second metal wiring layer.

Further, the first dielectric layer and the second dielectric layer are made from one or a combination of two or more of epoxy resin, silica gel, polyimide (PI), lead oxide (PBO), Benzocyclobutene (BCB), silicon oxide, phosphorosilicate glass and fluorine-containing glass, and the first metal wiring layer and the second metal wiring layer are made from one or a combination of two or more of copper, aluminum, nickel, gold, silver and titanium.

Preferably, the first metal joint pin and the second metal joint pin are made from one of Au, Ag, Cu, and Al.

Preferably, the metal bump comprises one of tin solder, silver solder and gold-tin alloy solder.

Preferably, the packaging structure further comprises a bottom filling layer formed between the antenna circuit chip and the redistribution layer to increase the bonding strength of the antenna circuit chip and the redistribution layer and protect the redistribution layer.

Preferably, the second antenna metal layer protrudes from the surface of the second packaging layer.

Preferably, the second antenna metal layer sinks into the second packaging layer, so that the side face of the second antenna metal layer is covered by the second packaging layer.

The present disclosure further provides a method for fabricating an antenna, comprising the following steps: 1) providing a supporting substrate, and forming a separation layer on the supporting substrate; 2) patterning a first antenna metal layer on the separation layer; 3) forming a first metal joint pin on the first antenna metal layer; 4) packaging the first antenna metal layer and the first metal joint pin with a first packaging layer, and exposing a top surface of the first metal joint pin from a top surface of the first packaging layer; 5) patterning a second antenna metal layer on the surface of the first packaging layer, wherein a portion of the second antenna metal layer is electrically connected with the first metal joint pin; 6) forming a second metal joint pin on said portion of the second antenna metal layer; 7) packaging the second antenna metal layer and the second metal joint pin with a second packaging layer, and exposing a top surface of the second metal joint pin from a top surface of the second packaging layer; 8) forming a redistribution layer on the top surface of the second packaging layer, wherein the redistribution layer is electrically connected with the second metal joint pin; 9) forming a metal bump on the redistribution layer; 10) providing an antenna circuit chip, and bonding the antenna circuit chip to the redistribution layer; and 11) separating the first packaging layer from the supporting substrate based on the separation layer.

Preferably, the supporting substrate comprises one of a glass substrate, a metal substrate, a semiconductor substrate, a polymer substrate and a ceramic substrate; the separation layer comprises a polymer layer, and the polymer layer is first applied to the surface of the supporting substrate by a spin-coating process, and then cured by a UV curing or thermal curing process.

Preferably, the polymer layer comprises a light-to-heat-conversion LTHC layer, and the LTHC photo-thermal conversion layer is heated in step 11) by laser light, so that the first packaging layer and the supporting substrate are separated from each other at the LTHC photo-thermal conversion layer.

Preferably, the first metal joint pin is manufactured by a wire bonding process in step 3), the second metal joint pin is manufactured by a wire bonding process in step 6), the wire bonding process is one of a hot press wire bonding process, an ultrasonic wire bonding process and a hot press ultrasonic wire bonding process, and the first metal joint pin and the second metal joint pin are made from one of Au, Ag, Cu and Al.

Preferably, step 4) of packaging the first antenna metal layer and the first metal joint pin with a first packaging layer adopts one of the following methods: compression molding, transfer molding, liquid seal molding, vacuum lamination and spin coating, and the second packaging layer is made from one of polyimide, silica gel and epoxy resin; step 7) of packaging the second antenna metal layer and the second metal joint pin with a second packaging layer adopts one of the following methods: compression molding, transfer molding, liquid seal molding, vacuum lamination and spin coating, and the second packaging layer is made from one of polyimide, silica gel and epoxy resin.

Preferably, step 8) of manufacturing the redistribution layer comprises: 8-1) forming a first dielectric layer on the surface of the second packaging layer by a chemical vapor deposition process or a physical vapor deposition process, and etching the first dielectric layer to form a patterned first dielectric layer; 8-2) forming a first metal layer on the surface of the patterned first dielectric layer by a chemical vapor deposition process, an evaporation process, a sputtering process, an electroplating process, or an electroless plating process, and etching the first metal layer to form a patterned first metal wiring layer, wherein the first metal wiring layer is electrically connected with the second metal joint pin; 8-3) forming a second dielectric layer on the surface of the patterned first metal wiring layer by a chemical vapor deposition process or a physical vapor deposition process, and etching the dielectric layer to form a patterned second dielectric layer; 8-4) forming a second metal layer on the surface of the patterned second dielectric layer by a chemical vapor deposition process, an evaporation process, a sputtering process, an electroplating process, or an electroless plating process, and etching the second metal layer to form a patterned second metal wiring layer, wherein the second metal wiring layer is electrically connected with the first metal wiring layer.

Preferably, the first dielectric layer and the second dielectric layer are made from one or a combination of two or more of epoxy resin, silica gel, PI, PBO, BCB, silicon oxide, phosphorosilicate glass and fluorine-containing glass, and the first metal wiring layer and the second metal wiring layer are made from one or a combination of two or more of copper, aluminum, nickel, gold, silver and titanium.

Preferably, the metal bump comprises one of tin solder, silver solder and gold-tin alloy solder.

Preferably, between step 10) and step 11), the packaging method further comprises: forming a bottom filling layer between the antenna circuit chip and the redistribution layer to increase the bonding strength of the antenna circuit chip and the redistribution layer and protect the redistribution layer.

The present disclosure further provides a method for fabricating an antenna, comprising the steps of: 1) providing a supporting substrate, and forming a separation layer on the supporting substrate; 2) forming a redistribution layer on the separation layer, wherein the redistribution layer has a first surface connected with the separation layer and an opposite second surface; 3) forming a first metal joint pin on the second surface of the redistribution layer; 4) packaging the first metal joint pin and the redistribution layer with a first packaging layer, and exposing the first metal joint pin exposed from the top surface of the first packaging layer; 5) patterning a first antenna metal layer on the surface of the first packaging layer, wherein a portion of the first antenna metal layer is electrically connected with the first metal joint pin; 6) forming a second metal joint pin on the first antenna metal layer; 7) packaging the first antenna metal layer and the second metal joint pin with a second packaging layer, and exposing a top of the second metal joint pin from a top surface of the second packaging layer; 8) forming a second antenna metal layer on the surface of the second packaging layer; 9) separating the redistribution layer from the supporting substrate based on the separation layer to expose the first surface of the redistribution layer; 10) forming a metal bump on the first surface of the redistribution layer; and 11) providing an antenna circuit chip, and bonding the antenna circuit chip to the first surface of the redistribution layer.

Preferably, the supporting substrate comprises one of a glass substrate, a metal substrate, a semiconductor substrate, a polymer substrate and a ceramic substrate; the separation layer comprises a polymer layer, and the polymer layer is first applied to the surface of the supporting substrate by a spin-coating process, and then cured by a UV curing or thermal curing process.

Preferably, the polymer layer comprises an LTHC photo-thermal conversion layer, and the LTHC photo-thermal conversion layer is heated in step 9) by laser light, so that the second packaging layer and the supporting substrate are separated from each other at the LTHC photo-thermal conversion layer.

Preferably, step 2) of manufacturing the redistribution layer comprises the steps of 2-1) forming a first dielectric layer on the surface of the separation layer by a chemical vapor deposition process or a physical vapor deposition process, and etching the first dielectric layer to form a patterned first dielectric layer; 2-2) forming a first metal layer on the surface of the patterned first dielectric layer by a chemical vapor deposition process, an evaporation process, a sputtering process, an electroplating process, or an electroless plating process, and etching the first metal layer to form a patterned first metal wiring layer; 2-3) forming a second dielectric layer on the surface of the patterned first metal wiring layer by a chemical vapor deposition process or a physical vapor deposition process, and etching the dielectric layer to form a patterned second dielectric layer; and 2-4) forming a second metal layer on the surface of the patterned second dielectric layer by a chemical vapor deposition process, an evaporation process, a sputtering process, an electroplating process, or an electroless plating process, and etching the second metal layer to form a patterned second metal wiring layer, wherein the second metal wiring layer is electrically connected with the first metal wiring layer.

Preferably, the first dielectric layer and the second dielectric layer are made from one or a combination of two or more of epoxy resin, silica gel, PI, PBO, BCB, silicon oxide, phosphorosilicate glass and fluorine-containing glass, and the first metal wiring layer and the second metal wiring layer are made from one or a combination of two or more of copper, aluminum, nickel, gold, silver and titanium.

Preferably, the first metal joint pin is manufactured by a wire bonding process in step 3), the second metal joint pin is manufactured by a wire bonding process in step 6), the wire bonding process is one of a hot press wire bonding process, an ultrasonic wire bonding process and a hot press ultrasonic wire bonding process, and the first metal joint pin and the second metal joint pin are made from one of Au, Ag, Cu and Al.

Preferably, step 4) of packaging the first metal joint pin and the redistribution layer with a first packaging layer adopts one of the following methods: compression molding, transfer molding, liquid seal molding, vacuum lamination and spin coating, and the second packaging layer is made from one of polyimide, silica gel and epoxy resin; step 7) of packaging the first antenna metal layer and the second metal joint pin with a second packaging layer adopts one of the following methods: compression molding, transfer molding, liquid seal molding, vacuum lamination and spin coating, and the second packaging layer is made from one of polyimide, silica gel and epoxy resin.

Preferably, the metal bump comprises one of tin solder, silver solder and gold-tin alloy solder.

Preferably, the packaging method further comprises step 12): forming a bottom filling layer between the antenna circuit chip and the redistribution layer to increase the bonding strength of the antenna circuit chip and the redistribution layer and protect the redistribution layer.

DESCRIPTION OF REFERENCE NUMBERS

101 Supporting substrate
102 Separation layer
103 First Antenna metal layer
104 First Metal joint pin
105 First Packaging layer
106 Second Antenna metal layer
107 Second Metal joint pin
108 Second Packaging layer
109 Redistribution layer
110 Metal bump
111 Antenna circuit chip
112 Bottom filling layer

DETAILED DESCRIPTION OF THE PREFERRED EMBODIMENTS

The embodiments of the present disclosure will be described below with reference to specific examples. Those skilled in the art can easily understand other advantages and effects of the present disclosure by the contents disclosed in the specification. The present disclosure can also be implemented or applied through other different specific embodiments. The details in the specification can also be based on different viewpoints and applications, and various modifications or changes can be made without departing from the spirit of the present disclosure.

Please refer to FIGS. 1-28. It should be noted that the illustration provided in the embodiments merely illustrates the basic idea of the present disclosure in a schematic manner, only the components related to the present disclosure are shown in the illustration, the components are not drawn in accordance with actual number, shape and dimension, the form, quantity and proportion of the components can be changed freely in actual implementation, and the layout pattern of the components may also be more complicated.

Embodiment 1

Figure 28:
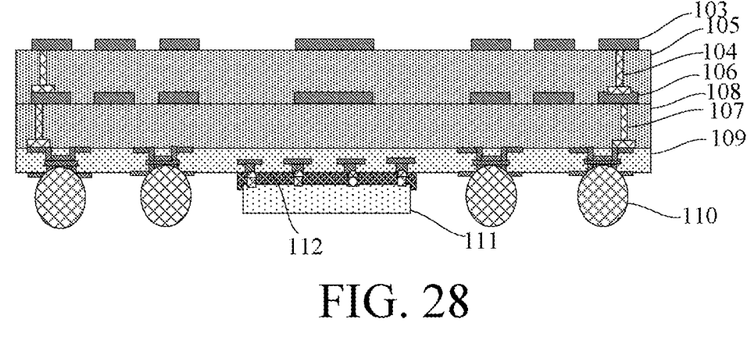
FIG. 28 shows the structural diagram of an antenna package according to the present disclosure.

As shown in FIG. 28, the present embodiment provides a packaging structure for an antenna. The packaging structure comprises a redistribution layer 109, a second metal joint pin 107, a second packaging layer 108, a second antenna metal layer 106, a first metal joint pin 104, a first packaging layer 105, a first antenna metal layer 103, a metal bump 110, an antenna circuit chip 111, and a bottom filling layer 112.

As shown in FIG. 28, the redistribution layer 109 has a first surface facing exterior and an opposite second surface facing interior of the chip.

As shown in FIG. 28, the redistribution layer 109 comprises a patterned first dielectric layer, a patterned first metal wiring layer, a patterned second dielectric layer and a patterned second metal wiring layer which are sequentially stacked, wherein the first metal wiring layer is electrically connected with the second metal wiring layer. Further, the first dielectric layer and the second dielectric layer are made from one or a combination of two or more of epoxy resin, silica gel, PI, PBO, BCB, silicon oxide, phosphorosilicate glass and fluorine-containing glass, and the first metal wiring layer and the second metal wiring layer are made from one or a combination of two or more of copper, aluminum, nickel, gold, silver and titanium.

As shown in FIG. 28, the second metal joint pin 107 is formed on the second surface of the redistribution layer 109, and is electrically connected with the redistribution layer 109.

The second metal joint pin 107 is made from a metal material like Au, Ag, Cu, and Al.

As shown in FIG. 28, the second packaging layer 108 covers the second metal joint pin 107 and the redistribution layer 109. Meanwhile, the second metal joint pin 107's top surface is exposed.

The second packaging layer 108 is made from one of polyimide, silica gel and epoxy resin. The top surface of the second packaging layer 108 is a grounded or polished flat surface, to improve the quality of the second antenna metal layer 106.

As shown in FIG. 28, the second antenna metal layer 106 is formed on the second packaging layer 108, and the second antenna metal layer 106 is electrically connected with the second metal joint pin 107.

The material of the second antenna metal layer 106 may be Au, or Cu, etc. The second antenna metal layer 106 may have various different patterns according to performance requirements.

As shown in FIG. 28, the second metal joint pin 107 is formed on the second antenna metal layer 106.

The second metal joint pin 107 is made from one of Au, Ag, Cu, and Al.

As shown in FIG. 28, the first packaging layer 105 covers the second antenna metal layer 106, and exposes the second metal joint pin 107, and the second metal joint pin 107 the top surface of the first packaging layer 105.

The first packaging layer 105 is made from one of polyimide, silica gel and epoxy resin. The top surface of the first packaging layer 105 is a ground or polished flat surface, so as to improve the quality of the first antenna metal layer 103.

As shown in FIG. 28, the first antenna metal layer 103 is formed on the first packaging layer 105, and the first antenna metal layer 103 protrudes from the surface of the first packaging layer 105. The second antenna metal layer 106 may be made from Au, Cu, etc., and the second antenna metal layer 106 may have various different patterns according to performance requirements.

As shown in FIG. 28, the metal bump 110 is formed on the first surface of the redistribution layer 109. The metal bump 110 comprises a solder material like f tin solder, silver solder and gold-tin alloy solder.

As shown in FIG. 28, the antenna circuit chip 111 is bonded to the first surface of the redistribution layer 109, and the antenna circuit chip 111 is electrically connected with the second antenna metal layer 106 and the first antenna metal layer 103 through the redistribution layer 109, the second metal joint pin 107 and the first metal joint pin 104, so as to realize the functions of the antenna. Based on the structure, an antenna packaging structure with more layers can be realized by more metal joint pins, packaging layers and antenna metal layers.

As shown in FIG. 28, the packaging structure further comprises a bottom filling layer 112 filled between the antenna circuit chip 111 and the redistribution layer 109 to increase the bonding strength of the antenna circuit chip 111 to the redistribution layer 109 and protect the redistribution layer 109.

Figure 15:
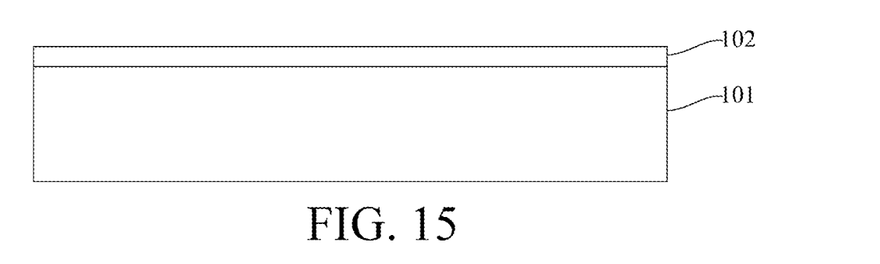
FIG. 15 to FIG. 27 show the steps of fabricating an antenna package and sequential structural diagrams according to another embodiment in the present disclosure.

As shown in FIG. 15 to FIG. 28, the embodiment further provides a packaging method for an antenna, comprising the following steps:

Step 1), providing a supporting substrate 101, and forming a separation layer 102 on the supporting substrate 101 as shown in FIG. 15.

As an example, the supporting substrate 101 may be one of a glass substrate, a metal substrate, a semiconductor substrate, a polymer substrate and a ceramic substrate. In the present embodiment, the supporting substrate 101 is a glass substrate, the cost of the glass substrate is lower than other types, it is easy to form the separation layer 102 on the surface of the glass substrate, and so it is easier for the subsequent separation process.

As an example, the separation layer 102 may be an adhesive tape or a polymer layer. In the case of a polymer layer, the polymer is first applied to the surface of the supporting substrate 101 by a spin-coating process, and then cured by a UV curing or thermal curing process.

In the present embodiment, the polymer layer comprises an LTHC photo-thermal conversion layer, and the LTHC photo-thermal conversion layer can be heated later in step 9) by laser light, so that a subsequently formed packaging layer 105 and the supporting substrate 101 are separated from each other at the LTHC photo-thermal conversion layer.

Figure 16:
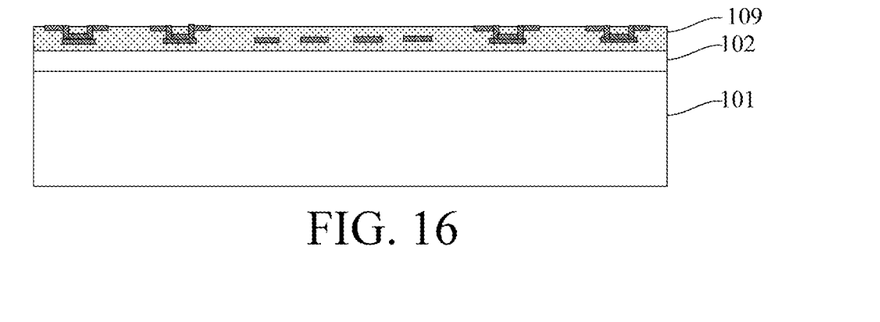

Step 2), forming a redistribution layer 109 on the separation layer 102, wherein the redistribution layer 109 comprises a first surface connected with the separation layer 102 and an opposite second surface, as shown in FIG. 16.

Forming the redistribution layer 109 of step 2) comprises the following steps:

Step 2-1), forming a first dielectric layer as part of 109 on the surface of the separation layer 102 by a chemical vapor deposition process or a physical vapor deposition process, and etching the first dielectric layer to form a patterned first dielectric layer, wherein the first dielectric layer is made from one or a combination of two or more of epoxy resin, silica gel, PI, PBO, BCB, silicon oxide, phosphorosilicate glass and fluorine-containing glass;

Step 2-2) forming a first metal layer (not shown) on the surface of the patterned first dielectric layer by a chemical vapor deposition process, an evaporation process, a sputtering process, an electroplating process, or an electroless plating process, and etching the first metal layer to form a patterned first metal wiring layer, wherein the first metal wiring layer is made from one or a combination of two or more of copper, aluminum, nickel, gold, silver and titanium;

Step 2-3) forming a second dielectric layer on the surface of the patterned first metal wiring layer by a chemical vapor deposition process or a physical vapor deposition process, and etching the dielectric layer to form a patterned second dielectric layer, wherein the second dielectric layer is made from one or a combination of two or more of epoxy resin, silica gel, PI, PBO, BCB, silicon oxide, phosphorosilicate glass and fluorine-containing glass; and Step 2-4) forming a second metal layer on the surface of the patterned second dielectric layer by a chemical vapor deposition process, an evaporation process, a sputtering process, an electroplating process, or an electroless plating process, and etching the second metal layer to form a patterned second metal wiring layer, wherein the second metal wiring layer is electrically connected with the first metal wiring layer. The second metal wiring layer is made from one or a combination of two or more of copper, aluminum, nickel, gold, silver, and titanium.

Figure 17:
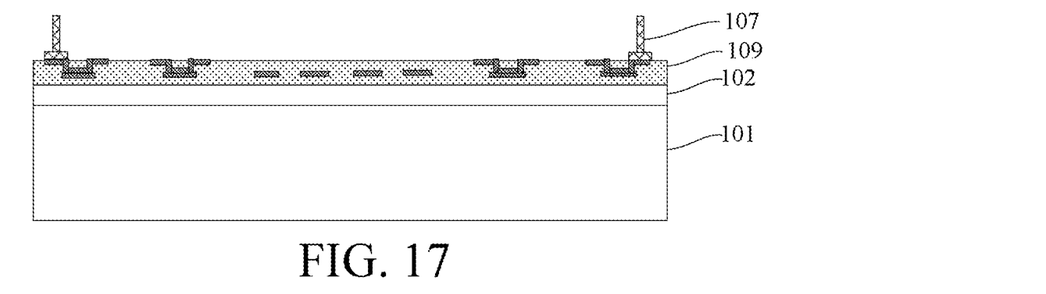

Step 3), forming a second metal joint pin 107 on the second surface of the redistribution layer 109, as shown in FIG. 17.

In step 3), the second metal joint pin 107 is manufactured by a wire bonding process, wherein the wire bonding process comprises one of a hot press wire bonding process, an ultrasonic wire bonding process and a hot press ultrasonic wire bonding process, and the second metal joint pin 107 is made from one of Au, Ag, Cu and Al.

Figure 18:
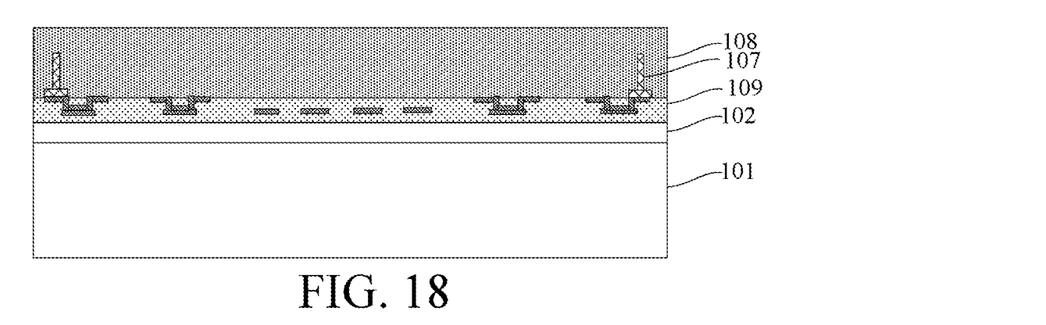
Figure 19:
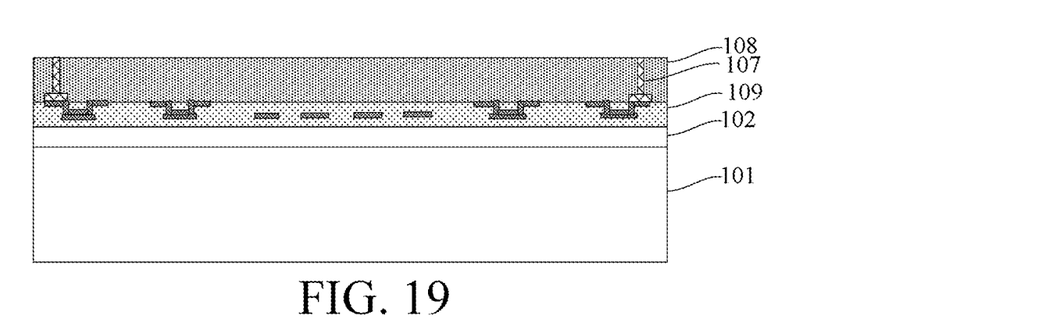

Step 4), packaging the second metal joint pin 107 and the redistribution layer 109 with a packaging layer 108, and then grinding the second packaging layer 108 until the second metal joint pin 107 is exposed from the top surface of the second packaging layer 108, as shown in FIG. 18 to FIG. 19.

Packaging the second metal joint pin 107 and the redistribution layer 109 with the second packaging layer 108 in step 4) adopts one of the following methods: compression molding, transfer molding, liquid seal molding, vacuum lamination and spin coating, and the second packaging layer 108 is made from one of polyimide, silica gel and epoxy resin.

Figure 20:
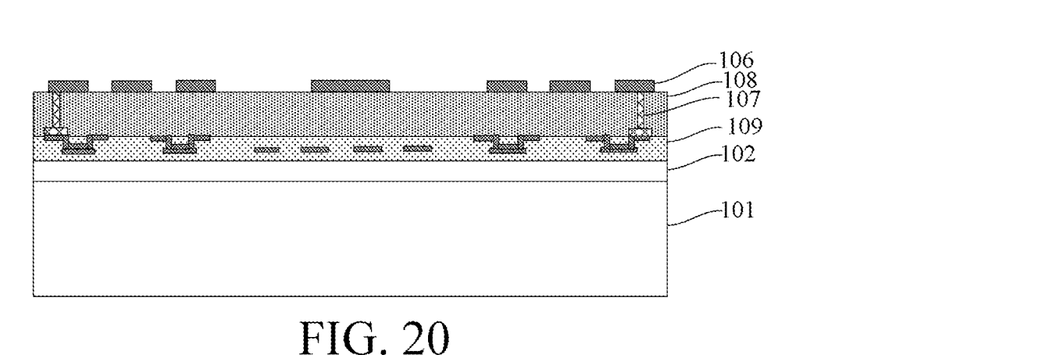

Step 5), forming a second antenna metal layer 106 on the surface of the second packaging layer 108, wherein the second antenna metal layer 106 is electrically connected with the second metal joint pin 107, as shown in FIG. 20.

For example, a metal layer may be formed on the surface of the second packaging layer 108 by evaporation or sputtering, and then the metal layer is patterned to form the second antenna metal layer 106 by an etching process. Optionally, the second antenna metal layer 106 may also be formed by a metal lift-off process, that is, forming a photoresist pattern on the surface of the second packaging layer 108 first, then forming a metal layer on the photoresist pattern by an evaporation or sputtering method, and finally removing the photoresist pattern and separating the metal layer from the photoresist pattern, with the patterned antenna metal layer 106 left on the surface of the second packaging layer 108.

Figure 21:
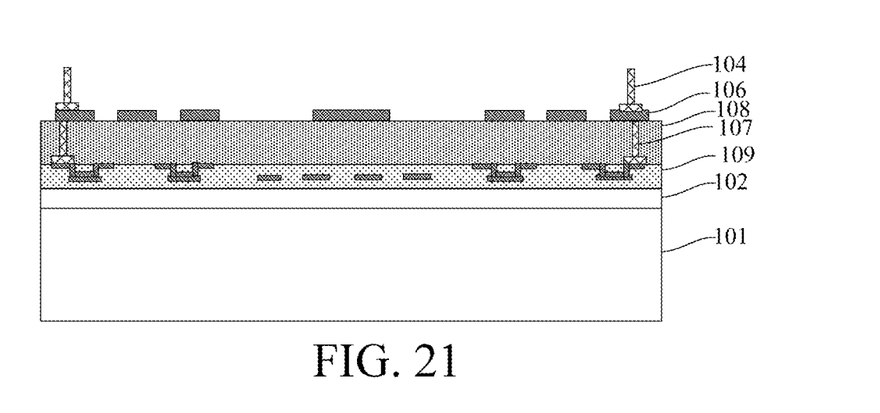

Step 6), forming a first metal joint pin 104 on the second antenna metal layer 106, as shown in FIG. 21.

In step 6), the first metal joint pin 104 is manufactured by a wire bonding process, wherein the wire bonding process is one of a hot press wire bonding process, an ultrasonic wire bonding process and a hot press ultrasonic wire bonding process, and the first metal joint pin 104 is made from one of Au, Ag, Cu and Al.

Figure 22:
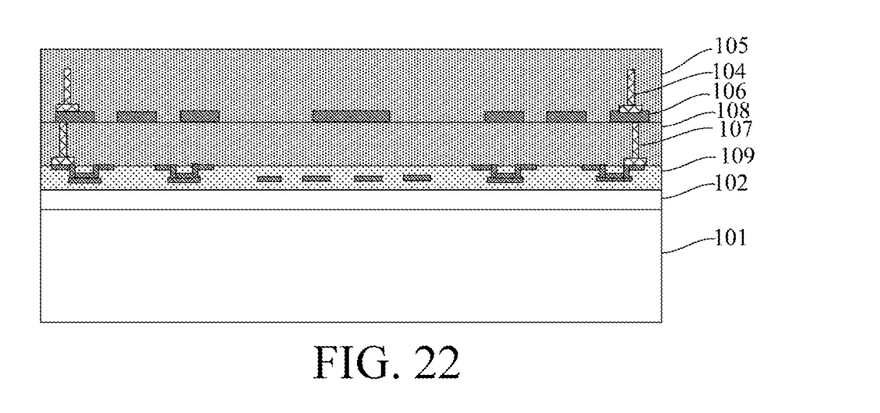
Figure 23:
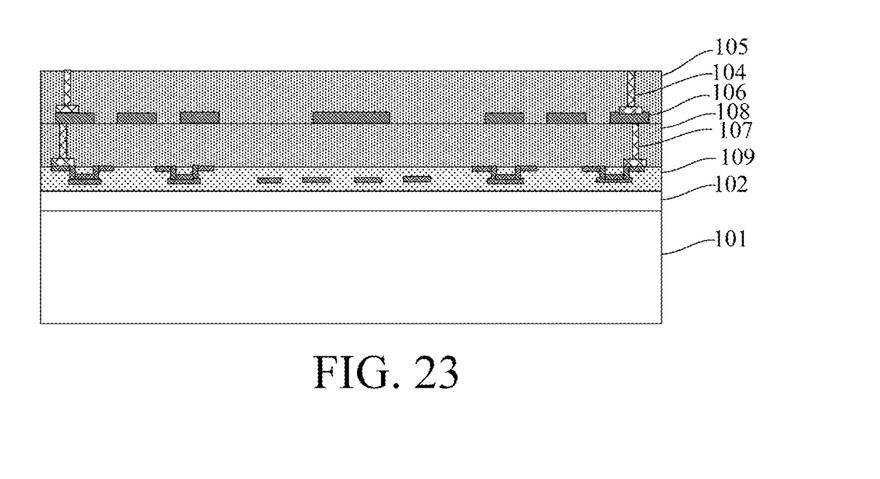

Step 7), packaging the second antenna metal layer 106 and the first metal joint pin 104 with a packaging layer 105, and then grinding the first packaging layer 105 until the first metal joint pin 104 is exposed from the top surface of the first packaging layer 105, as shown in FIG. 22 to FIG. 23.

Step 7) of packaging the second antenna metal layer 106 and the first metal joint pin 104 with a packaging layer 105 adopts one of the following methods: compression molding, transfer molding, liquid seal molding, vacuum lamination and spin coating, and the first packaging layer 105 is made from one of polyimide, silica gel and epoxy resin.

Figure 24:
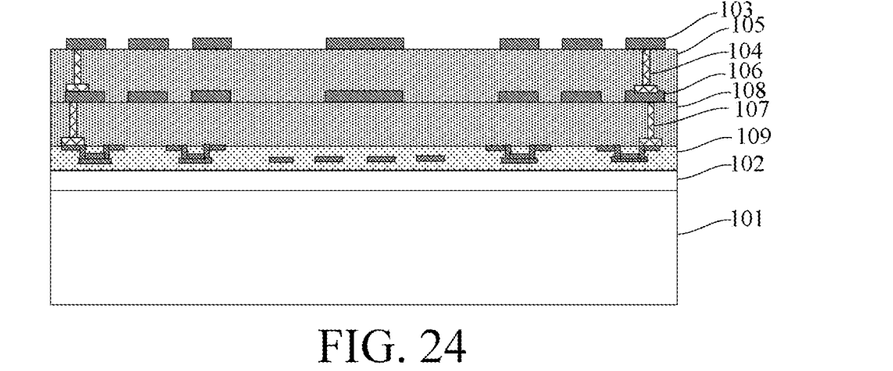

Step 8), forming an antenna metal layer 103 on the surface of the first packaging layer 105, as shown in FIG. 24.

For example, a metal layer may be formed on the surface of the first packaging layer 105 by an evaporation or sputtering method first, and the metal layer is patterned to form the first antenna metal layer 103 by an etching process. Of course, the first antenna metal layer 103 may also be formed by a metal lift-off process, that is, forming a photoresist pattern on the surface of the first packaging layer 105 first, then forming a metal layer on the photoresist pattern by an evaporation or sputtering method, and finally removing the photoresist pattern and separating the metal layer from the photoresist pattern, with the patterned antenna metal layer 103 left on the surface of the first packaging layer 105.

Figure 25:
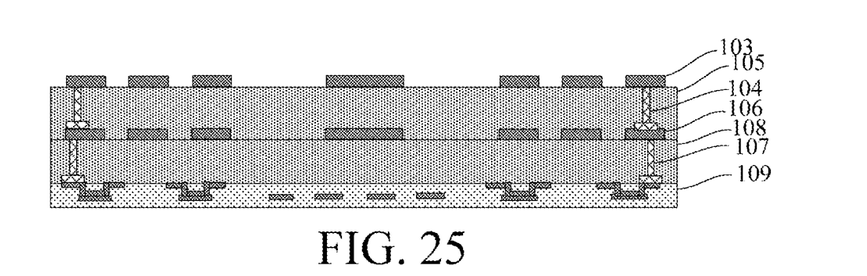

Step 9), separating the redistribution layer 109 from the supporting substrate 101 based on the separation layer 102 to expose the first surface of the redistribution layer 109, as shown in FIG. 25.

For example, the LTHC photo-thermal conversion layer is heated by laser light, so that the subsequently formed packaging layer 105 and the supporting substrate 101 are separated from each other at the LTHC photo-thermal conversion layer.

Figure 26:
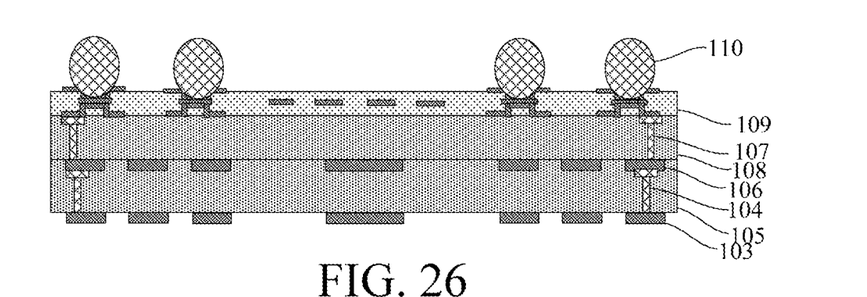

Step 10), forming a metal bump 110 on the first surface of the redistribution layer 109, as shown in FIG. 26.

The metal bump 110 comprises one of tin solder, silver solder and gold-tin alloy solder.

Figure 27:
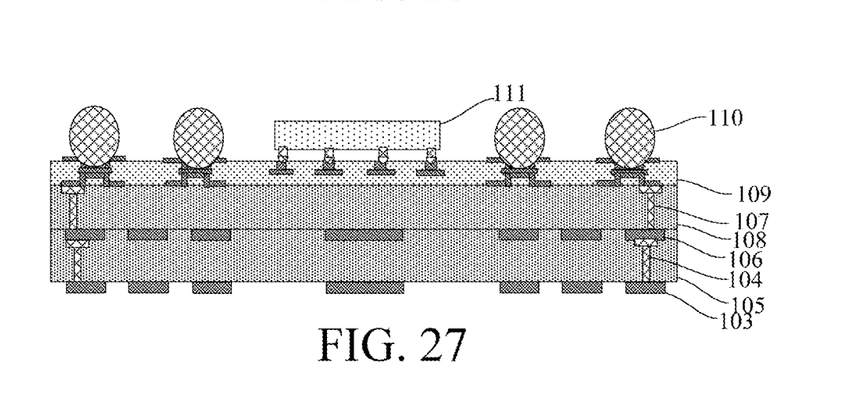

Step 11) and step 12) providing an antenna circuit chip 111, bonding the antenna circuit chip 111 to the first surface of the redistribution layer 109, and finally forming a bottom filling layer 112 between the antenna circuit chip 111 and the redistribution layer 109 to increase the bonding strength of the antenna circuit chip 111 and the redistribution layer 109 and protect the redistribution layer 109, as shown in FIG. 27 to FIG. 28.

Embodiment 2

Figure 1:
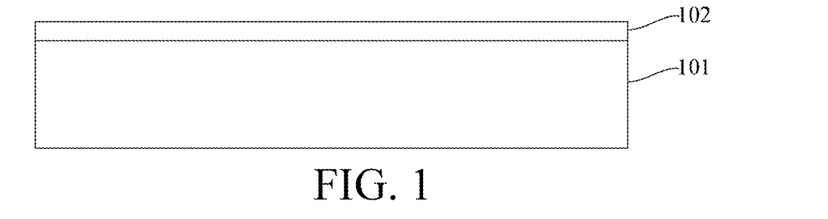
FIG. 1 to FIG. 14 show the steps of fabricating an antenna package and sequential structural diagrams according to an embodiment in the present disclosure.

As shown in FIG. 1 to FIG. 14, the present embodiment provides a packaging method for an antenna, comprising the following steps:

Step 1), providing a supporting substrate 101, and forming a separation layer 102 on the supporting substrate 101, as shown in FIG. 1.

As an example, the supporting substrate 101 comprises one of a glass substrate, a metal substrate, a semiconductor substrate, a polymer substrate and a ceramic substrate. In the present embodiment, the supporting substrate 101 is a glass substrate, the cost of the glass substrate is low, it is easy to form the separation layer 102 on the surface of the glass substrate, and the difficulty of the subsequent separation process can be reduced.

As an example, the separation layer 102 comprises one of an adhesive tape and a polymer layer. The polymer layer is first applied to the surface of the supporting substrate 101 by a spin-coating process, and then cured by a UV curing or thermal curing process.

The polymer layer comprises an LTHC photo-thermal conversion layer, and the LTHC photo-thermal conversion layer can be heated later in step 11) by laser light, so that the first packaging layer 105 and the supporting substrate 101 are separated from each other at the LTHC photo-thermal conversion layer.

Figure 2:
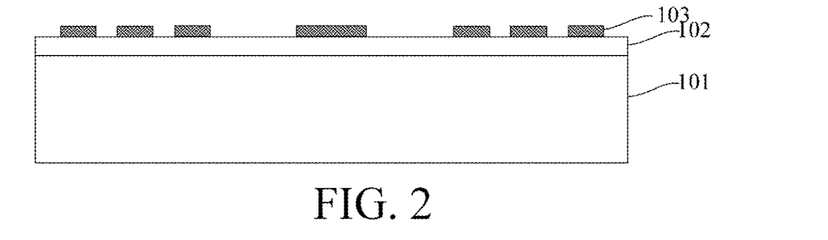

Step 2), forming an antenna metal layer 103 on the separation layer 102, as shown in FIG. 2.

For example, a metal layer may be formed on the surface of the separation layer 102 by an evaporation or sputtering method first, and then the metal layer is patterned form the first antenna metal layer 103 by an etching process. Optionally, the first antenna metal layer 103 may also be formed by a metal lift-off process, that is, forming a photoresist pattern on the surface of the separation layer 102 first, then forming a metal layer on the photoresist pattern by an evaporation or sputtering method, and finally removing the photoresist pattern and separating the metal layer from the photoresist pattern, with the patterned antenna metal layer 103 left on the surface of the separation layer 102.

Figure 3:
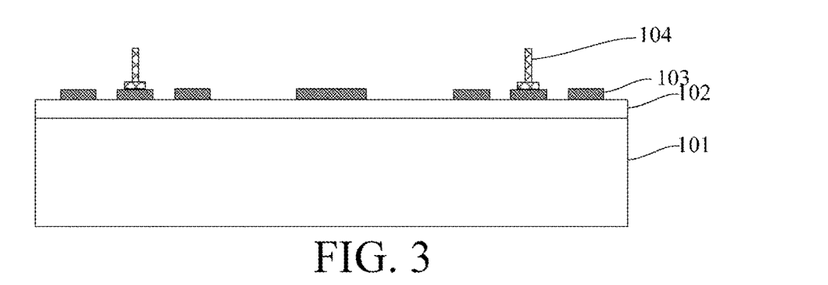

Step 3), forming a first metal joint pin 104 on the first antenna metal layer 103, as shown in FIG. 3.

The first metal joint pin 104 is manufactured by a wire bonding process, wherein the wire bonding process is one of a hot press wire bonding process, an ultrasonic wire bonding process and a hot press ultrasonic wire bonding process, and the first metal joint pin 104 is made from one of Au, Ag, Cu, and Al.

Figure 4:
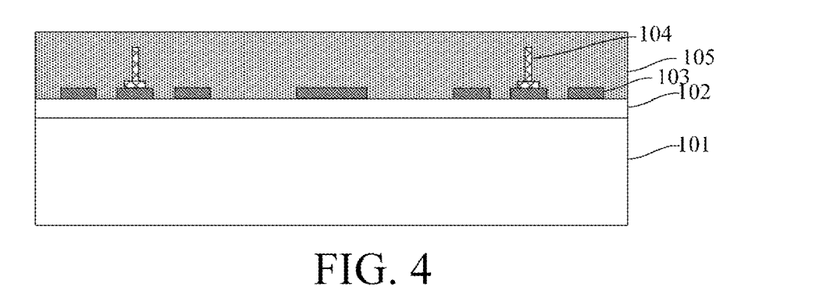
Figure 5:
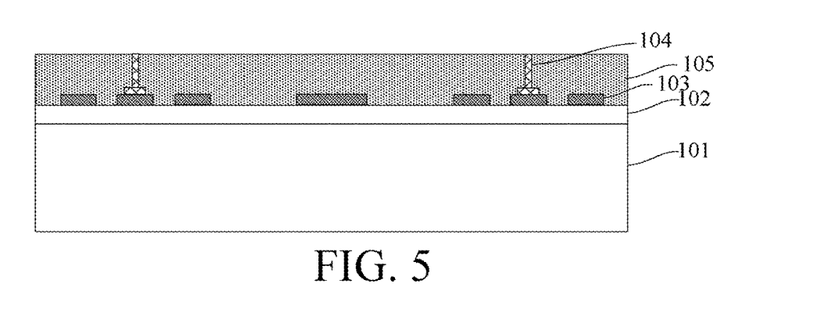

Step 4), packaging the first antenna metal layer 103 and the first metal joint pin 104 with a packaging layer 105, so that the first metal joint pin 104 is exposed from the top surface of the first packaging layer 105, as shown in FIG. 4 to FIG. 5.

The packaging of the first antenna metal layer 103 and the first metal joint pin 104 with a packaging layer 105 adopts one of the following methods: compression molding, transfer molding, liquid seal molding, vacuum lamination and spin coating, and the first packaging layer 105 is made from one of polyimide, silica gel and epoxy resin.

Figure 6:
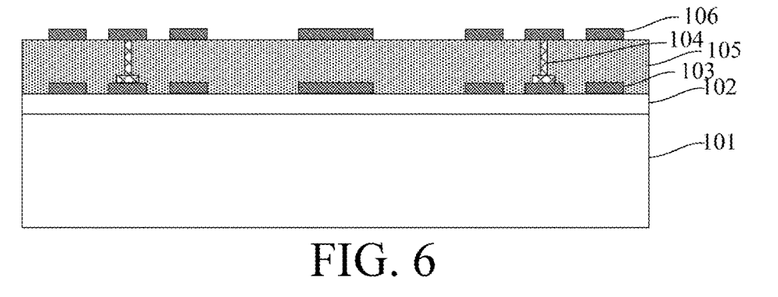

Step 5), forming an antenna metal layer 106 on the surface of the first packaging layer 105, wherein the second antenna metal layer 106 is electrically connected with the first metal joint pin 104, as shown in FIG. 6.

Figure 7:
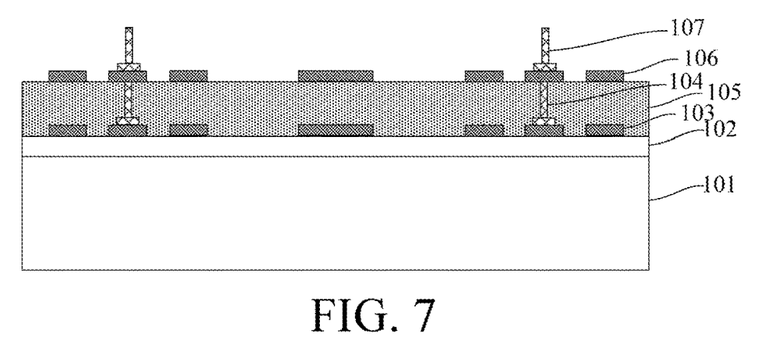

Step 6), forming a second metal joint pin 107 on the second antenna metal layer 106, as shown in FIG. 7.

The second metal joint pin 107 is manufactured by a wire bonding process, wherein the wire bonding process is one of a hot press wire bonding process, an ultrasonic wire bonding process and a hot press ultrasonic wire bonding process, and the first metal joint pin 107 and second metal joint pin 107 are made from one of Au, Ag, Cu and Al.

Figure 8:
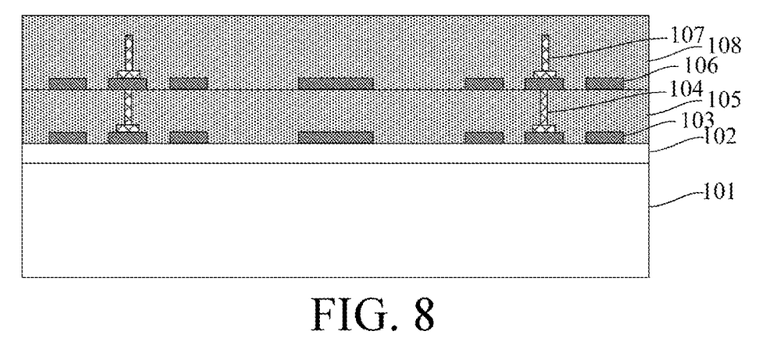
Figure 9:
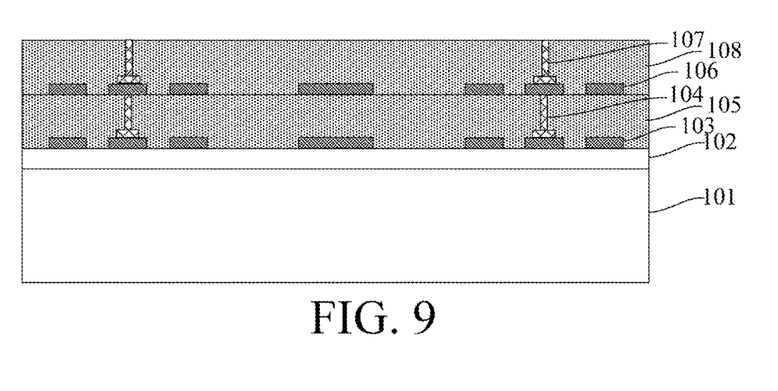

Step 7), packaging the second antenna metal layer 106 and second metal joint pin 107 with a packaging layer 108, so that second metal joint pin 107 is exposed from the top surface of the second packaging layer 108, as shown in FIG. 8 to FIG. 9.

The packaging of the second antenna metal layer 106 and second metal joint pin 107 with a packaging layer 108 adopts one of the following methods: compression molding, transfer molding, liquid seal molding, vacuum lamination and spin coating, and the second packaging layer 108 is made from one of polyimide, silica gel and epoxy resin.

Figure 10:
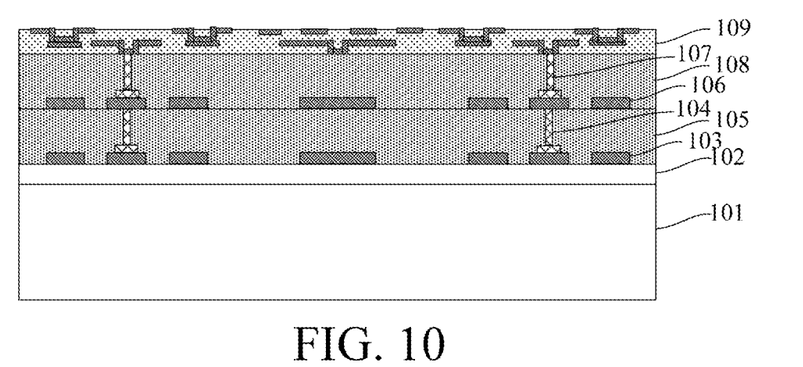

Step 8), forming a redistribution layer 109 on the surface of the second packaging layer 108, wherein the redistribution layer 109 is electrically connected with second metal joint pin 107, as shown in FIG. 10.

Step 8) of forming the redistribution layer 109 comprises the following steps:

8-1), forming a first dielectric layer on the surface of the second packaging layer 108 by a chemical vapor deposition process or a physical vapor deposition process, and etching the first dielectric layer to form a patterned first dielectric layer;

8-2) forming a first metal layer on the surface of the patterned first dielectric layer by a chemical vapor deposition process, an evaporation process, a sputtering process, an electroplating process, or an electroless plating process, and etching the first metal layer to form a patterned first metal wiring layer, wherein the first metal wiring layer is electrically connected with second metal joint pin 107;

8-3) forming a second dielectric layer on the surface of the patterned first metal wiring layer by a chemical vapor deposition process or a physical vapor deposition process, and etching the dielectric layer to form a patterned second dielectric layer; and 8-4) forming a second metal layer on the surface of the patterned second dielectric layer by a chemical vapor deposition process, an evaporation process, a sputtering process, an electroplating process, or an electroless plating process, and etching the second metal layer to form a patterned second metal wiring layer, wherein the second metal wiring layer is electrically connected with the first metal wiring layer.

The first dielectric layer and the second dielectric layer are made from one or a combination of two or more of epoxy resin, silica gel, PI, PBO, BCB, silicon oxide, phosphorosilicate glass and fluorine-containing glass, and the first metal wiring layer and the second metal wiring layer are made from one or a combination of two or more of copper, aluminum, nickel, gold, silver and titanium.

Figure 11:
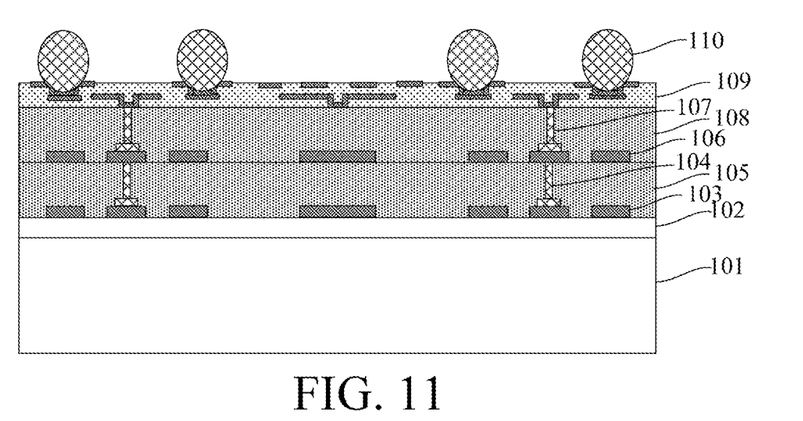

Step 9), forming a metal bump 110 on the redistribution layer 109, as shown in FIG. 11.

The metal bump 110 comprises one of tin solder, silver solder and gold-tin alloy solder.

Figure 12:
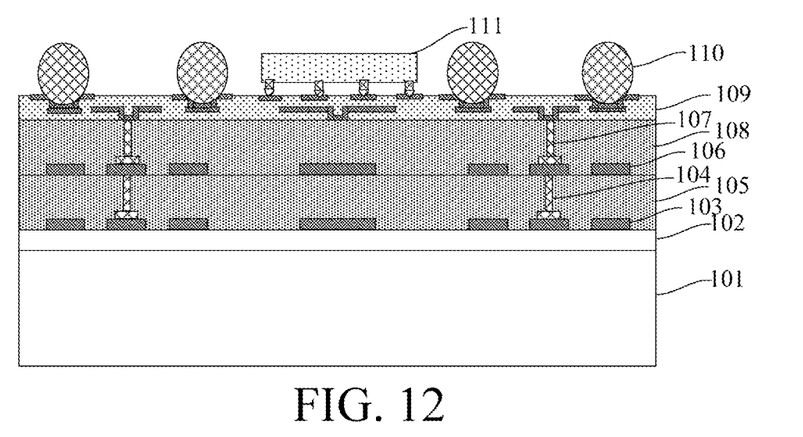

Step 10), providing an antenna circuit chip 111, and bonding the antenna circuit chip 111 to the redistribution layer 109, as shown in FIG. 12.

Between step 10) and step 11), the packaging method further comprises: forming a bottom filling layer 112 between the antenna circuit chip 111 and the redistribution layer 109 to increase the bonding strength of the antenna circuit chip 111 and the redistribution layer 109 and protect the redistribution layer 109.

Figure 13:
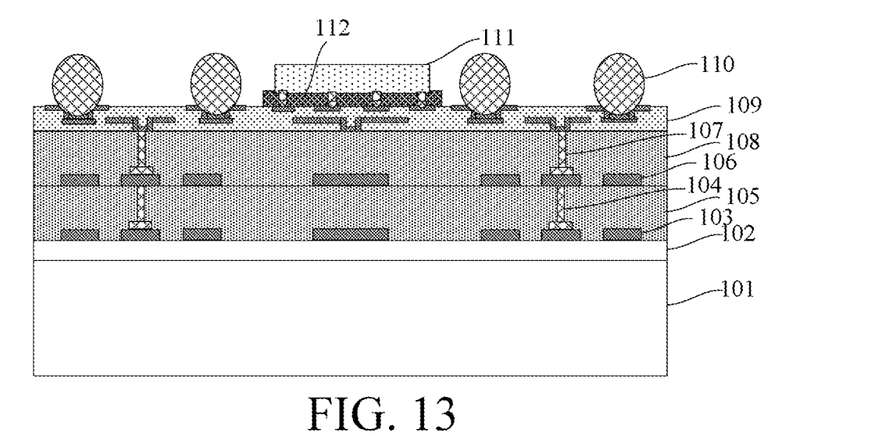
Figure 14:
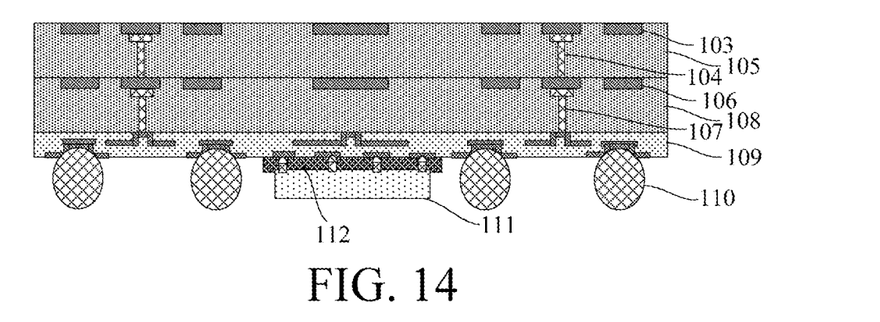

Step 11), separating the first packaging layer 105 from the supporting substrate 101 based on the separation layer 102, as shown in FIG. 13 to FIG. 14.

As shown in FIG. 14, the present embodiment further provides a packaging structure for an antenna. The basic structure is the same as that of embodiment 1, and the main difference from embodiment 1 lies in that the first antenna metal layer 103 of the packaging structure sinks into the first packaging layer 105, such that the side face of the first antenna metal layer 103 is covered by the first packaging layer 105, which can greatly improve the mechanical stability of the first antenna metal layer 103 and improve the overall performance of the packaging structure.

The disclosed device have the following benefits:

the packaging structure for an antenna according to the present disclosure adopts the redistribution layer to realize the integration of two or more antenna metal layers, greatly improving the efficiency and performance of the antenna, and the packaging structure and packaging method for an antenna according to the present disclosure have a high integration level; and In the present disclosure, a fan-out packaging method is adopted to package the antenna, which can effectively reduce the packaging volume, and make the packaging structure for an antenna have a high integration level and better packaging performance, thereby having a wide application prospect in the field of semiconductor packaging.

Therefore, the present disclosure effectively overcomes various disadvantages in the prior art and has high industrial utilization value.

The above-described embodiments merely illustrate the principles and effects of the present disclosure, but are not intended to limit the present disclosure. Any person skilled in the art can modify or change the above embodiments without departing from the spirit and scope of the present disclosure. Therefore, all equivalent modifications or changes made by persons of ordinary skill in the art without departing from the spirit and technical thought disclosed in the present disclosure shall still be covered by the claims of the present disclosure.

What is claimed is:

1. A method for fabricating an antenna, comprising:
1) providing a supporting substrate, and forming a separation layer on a first surface of the supporting substrate;
2) patterning a first antenna metal layer on the separation layer over the first surface of the supporting substrate;
3) forming a first metal joint pin on the first antenna metal layer over the first surface of the supporting substrate, in a separate process from the patterning of the first antenna metal layer, wherein the separate process forming the first metal joint pin is a wire bonding process;
4) packaging the first antenna metal layer and the first metal joint pin with a first packaging layer over the first surface of the supporting substrate, and exposing a top surface of the first metal joint pin from a top surface of the first packaging layer;

5) patterning a second antenna metal layer on the top surface of the first packaging layer, wherein a portion of the second antenna metal layer is electrically connected with the first metal joint pin;

6) forming a second metal joint pin on said portion of the second antenna metal layer over the first surface of the supporting substrate, in a separate process from the patterning of the second antenna metal layer, wherein the separate process forming the second metal joint pin is a wire bonding process;

7) packaging the second antenna metal layer and the second metal joint pin with a second packaging layer, and exposing a top surface of the second metal joint pin from a top surface of the second packaging layer;

8) forming a redistribution layer on the top surface of the second packaging layer over the first surface of the supporting substrate, wherein the redistribution layer is above the first and the second metal joint pins and is electrically connected with the second metal joint pin;

9) forming a metal bump on the redistribution layer over the first surface of the supporting substrate;

10) providing an antenna circuit chip on the redistribution layer next to the metal bump over the first surface of the supporting substrate, and bonding the antenna circuit chip to the redistribution layer; and 11) separating the first packaging layer from the first surface of the supporting substrate based on the separation layer.

2. A method for fabricating an antenna according to claim 1, wherein the supporting substrate is selected from a group consisting of a glass substrate, a metal substrate, a semiconductor substrate, a polymer substrate and a ceramic substrate; and wherein the separation layer comprises a polymer layer, and wherein the polymer layer is first applied to a surface of the supporting substrate by a spin-coating process, and then cured by a UV curing or thermal curing process.

3. A method for fabricating an antenna according to claim 2, wherein the polymer layer comprises a photo-thermal conversion layer, and wherein the photo-thermal conversion layer is heated by laser light in step 11), so that the first packaging layer and the supporting substrate are separated from each other at the photo-thermal conversion layer.

4. A method for fabricating an antenna according to claim 1, wherein the wire bonding process in step 3) and step 6) is one of a hot press wire bonding process, an ultrasonic wire bonding process and a hot press ultrasonic wire bonding process, and the first metal joint pin and the second metal joint pin are made from one of gold (Au), silver (Ag), copper (Cu) and aluminum (Al).

5. A method for fabricating an antenna according to claim 1, wherein step 4) of packaging the first antenna metal layer and the first metal joint pin with a first packaging layer adopts one of the following methods: compression molding, transfer molding, liquid seal molding, vacuum lamination and spin coating, and the second packaging layer is made from one of polyimide, silica gel and epoxy resin; step 7) of packaging the second antenna metal layer and the second metal joint pin with a second packaging layer adopts one of the following methods: compression molding, transfer molding, liquid seal molding, vacuum lamination and spin coating, and the second packaging layer is made from one of polyimide, silica gel and epoxy resin.

6. A method for fabricating an antenna according to claim 1, wherein step 8) of manufacturing the redistribution layer comprises:

8-1) forming a first dielectric layer on a surface of the second packaging layer by a chemical vapor deposition process or a physical vapor deposition process, and etching the first dielectric layer to form a patterned first dielectric layer;

8-2) forming a first metal layer on a surface of the patterned first dielectric layer by a chemical vapor deposition process, an evaporation process, a sputtering process, an electroplating process, or an electroless plating process, and etching the first metal layer to form a patterned first metal wiring layer, wherein the patterned first metal wiring layer is electrically connected with the second metal joint pin;

8-3) forming a second dielectric layer on a surface of the patterned first metal wiring layer by a chemical vapor deposition process or a physical vapor deposition process, and etching the second dielectric layer to form a patterned second dielectric layer; and 8-4) forming a second metal layer on a surface of the patterned second dielectric layer by a chemical vapor deposition process, an evaporation process, a sputtering process, an electroplating process, or an electroless plating process, and etching the second metal layer to form a patterned second metal wiring layer, wherein the patterned second metal wiring layer is electrically connected with the patterned first metal wiring layer.

7. A method for fabricating an antenna according to claim 6, wherein the first dielectric layer and the second dielectric layer are made from one or a combination of two or more of epoxy resin, silica gel, polyimide (PI), lead oxide (PBO), Benzocyclobutene (BCB), silicon oxide, phosphorosilicate glass and fluorine-containing glass; wherein the patterned first metal wiring layer and the patterned second metal wiring layer are made from one or a combination of two or more of copper, aluminum, nickel, gold, silver and titanium.

8. A method for fabricating an antenna according to claim 1, wherein the metal bump comprises one of tin solder, silver solder and gold-tin alloy solder.

9. A method for fabricating an antenna according to claim 1, wherein between step 10) and step 11), the packaging method further comprises: forming a bottom filling layer between the antenna circuit chip and the redistribution layer to increase the bonding strength of the antenna circuit chip and the redistribution layer and protect the redistribution layer.

10. The method for fabricating the antenna in claim 1, wherein in step 2), an etching process is applied to pattern the first antenna metal layer, and wherein in step 5), an etching process is applied to pattern the second antenna metal layer.

11. The method for fabricating the antenna in claim 1, wherein in step 2), a metal lift-off process is applied to pattern the first antenna metal layer, and wherein in step 5), a metal lift-off process is applied to pattern the second antenna metal layer.

12. A method for fabricating an antenna, comprising:

1) providing a supporting substrate, and forming a separation layer on a first surface of the supporting substrate;

2) forming a redistribution layer on the separation layer over the first surface of the supporting substrate, wherein the redistribution layer has a first surface connected with the separation layer and an opposite second surface;

3) forming a first metal joint pin on the second surface of the redistribution layer over the first surface of the supporting substrate;
4) packaging the first metal joint pin and the redistribution layer with a first packaging layer, and exposing the first metal joint pin from a top surface of the first packaging layer;
5) patterning a first antenna metal layer on the top surface of the first packaging layer over the first surface of the supporting substrate, wherein a portion of the first antenna metal layer is electrically connected with the first metal joint pin;
6) forming a second metal joint pin on the first antenna metal layer over the first surface of the supporting substrate, wherein the second metal joint pin is manufactured by a wire bonding process;
7) packaging the first antenna metal layer and the second metal joint pin with a second packaging layer, and exposing a top of the second metal joint pin from a top surface of the second packaging layer;
8) forming a second antenna metal layer on the top surface of the second packaging layer over the first surface of the supporting substrate;
9) separating the redistribution layer from the first surface of the supporting substrate based on the separation layer to expose the first surface of the redistribution layer;
10) forming a metal bump on the first surface of the redistribution layer; and
11) providing an antenna circuit chip on the first surface of the redistribution layer and bonding the antenna circuit chip to the first surface of the redistribution layer.

13. A method for fabricating an antenna according to claim 12, wherein the supporting substrate comprises one of a glass substrate, a metal substrate, a semiconductor substrate, a polymer substrate and a ceramic substrate; the separation layer comprises a polymer layer, and the polymer layer is first applied to a surface of the supporting substrate by a spin-coating process, and then cured by an ultraviolet (UV) curing or thermal curing process.

14. A method for fabricating an antenna according to claim 13, wherein the polymer layer comprises a photo-thermal conversion layer, and the photo-thermal conversion layer is heated in step 9) by laser light, so that the redistribution layer and the supporting substrate are separated from each other at the photo-thermal conversion layer.

15. A method for fabricating an antenna according to claim 12, wherein step 2) of manufacturing the redistribution layer comprises a plurality of steps of:
2-1) forming a first dielectric layer on a surface of the separation layer by a chemical vapor deposition process or a physical vapor deposition process, and etching the first dielectric layer to form a patterned first dielectric layer;
2-2) forming a first metal layer on a surface of the patterned first dielectric layer by a chemical vapor deposition process, an evaporation process, a sputtering process, an electroplating process, or an electroless plating process, and etching the first metal layer to form a patterned first metal wiring layer;
2-3) forming a second dielectric layer on a surface of the patterned first metal wiring layer by a chemical vapor deposition process or a physical vapor deposition process, and etching the second dielectric layer to form a patterned second dielectric layer; and
2-4) forming a second metal layer on a surface of the patterned second dielectric layer by a chemical vapor deposition process, an evaporation process, a sputtering process, an electroplating process, or an electroless plating process, and etching the second metal layer to form a patterned second metal wiring layer, wherein the patterned second metal wiring layer is electrically connected with the patterned first metal wiring layer.

16. A method for fabricating an antenna according to claim 15, wherein the first dielectric layer and the second dielectric layer are made from one or a combination of two or more of epoxy resin, silica gel, PI, PBO, BCB, silicon oxide, phosphorosilicate glass and fluorine-containing glass, and the patterned first metal wiring layer and the patterned second metal wiring layer are made from one or a combination of two or more of copper, aluminum, nickel, gold, silver and titanium.

17. A method for fabricating an antenna as in claim 12, the wire bonding process in step 3) and step 6) is one of a hot press wire bonding process, an ultrasonic wire bonding process and a hot press ultrasonic wire bonding process, the first metal joint pin and the second metal joint pin are made from one of Au, Ag, Cu and Al.

18. A method for fabricating an antenna according to claim 12, wherein step 4) of packaging the first metal joint pin and the redistribution layer with a first packaging layer adopts one of the following methods: compression molding, transfer molding, liquid seal molding, vacuum lamination and spin coating, and the second packaging layer is made from one of polyimide, silica gel and epoxy resin; step 7) of packaging the first antenna metal layer and the second metal joint pin with a second packaging layer adopts one of the following methods: compression molding, transfer molding, liquid seal molding, vacuum lamination and spin coating, and the second packaging layer is made from one of polyimide, silica gel and epoxy resin.

19. A method for fabricating an antenna according to claim 12, wherein the metal bump comprises one of tin solder, silver solder and gold-tin alloy solder.

20. A method for fabricating an antenna according to claim 12, further comprising step 12): forming a bottom filling layer between the antenna circuit chip and the redistribution layer to increase a bonding strength of the antenna circuit chip and the redistribution layer and protect the redistribution layer.

* * * * *

UNITED STATES PATENT AND TRADEMARK OFFICE
CERTIFICATE OF CORRECTION

PATENT NO. : 10,886,594 B2  
APPLICATION NO. : 16/286310  
DATED : January 5, 2021  
INVENTOR(S) : Chen et al.

Page 1 of 1

It is certified that error appears in the above-identified patent and that said Letters Patent is hereby corrected as shown below:

On the Title Page

Item (30), add:
(30) Foreign Application Priority Data  
Mar. 16, 2016   CN ........................... 2018203598256  
Mar. 16, 2016   CN ........................... 2018102175884

Signed and Sealed this  
Eighteenth Day of January, 2022

Drew Hirshfeld  
*Performing the Functions and Duties of the*  
*Under Secretary of Commerce for Intellectual Property and*  
*Director of the United States Patent and Trademark Office*